United States Patent [19]

Petersen et al.

[11] Patent Number: 5,173,664
[45] Date of Patent: Dec. 22, 1992

[54] PHASE LOCKED LOOP HAVING CONSTANT GAIN FOR RECOVERING CLOCK FROM NON-UNIFORMLY SPACED DATA

[75] Inventors: Corey D. Petersen, Pleasanton; Paul S. Cheung, Woodbridge, both of Calif.

[73] Assignee: Minnesota Mining and Manufacturing Company, St. Paul, Minn.

[21] Appl. No.: 760,789

[22] Filed: Sep. 16, 1991

[51] Int. Cl.⁵ .......................................... H03L 7/093
[52] U.S. Cl. ................................... 331/1 A; 331/17; 331/25; 375/120
[58] Field of Search ........................ 331/1 A, 17, 25; 375/120

[56] References Cited

U.S. PATENT DOCUMENTS 3,614,635  10/1971  La Pine et al. ............... 331/1 A X
4,644,420  2/1987   Buchan ........................ 375/120 X Primary Examiner—Siegfried H. Grimm
Attorney, Agent, or Firm—Gary L. Griswold; Walter N. Kirn; William B. Barte

[57] ABSTRACT

A constant loop gain phase lock loop for recovering a clock from non-uniformly spaced data pulses utilizes a programmable current source and charge pump whereby the current into the charge pump is proportional to the number of VCO clock periods between data pulses. As the time between pulses increases the current charging the pump increases and when the time between pulses decreases the current charging the pump decreases to maintain a constant loop gain independent of the data pattern.

3 Claims, 3 Drawing Sheets

PHASE LOCKED LOOP HAVING CONSTANT GAIN FOR RECOVERING CLOCK FROM NON-UNIFORMLY SPACED DATA

BACKGROUND OF THE INVENTION

This invention relates generally to phase locked loop circuitry, and more particularly the invention relates to phase locked loop circuitry for providing a clock signal which is synchronous with data that is encoded by non-uniformly spaced data pulses.

Phase locked loop circuits are utilized in tape and disk drives to recover clock information necessary for the reading of data from the data storage medium. Sample and hold type phase comparators are typically employed in generating clock signals from encoded data having non-uniform data patterns. Further, the comparators compensate for variations in the speed of the storage medium.

U.S. Pat. No. 4,644,420 discloses a digital phase locked loop oscillator that provides a constant loop gain independent of the encoded data. The phase locked loop has a sample and hold phase comparator which utilizes a voltage controlled oscillator running at 32 times the data rate. However, such an oscillator frequency is beyond the practical limits of existing integrated circuit technologies.

The present invention is a phase locked loop circuit which recovers a clock from non-uniformly spaced data pulses using digital circuitry which is compatible with existing integrated circuit technology.

SUMMARY OF THE INVENTION

Accordingly, an object of the invention is an improved digital phase locked loop oscillator for recovering a clock from non-uniformly spaced data.

A feature of the invention is charge pump means which maintains a constant loop gain independent of data pattern.

Briefly, a programmable current source is provided to make charge pump current proportional to the number of VCO clock periods between data pulses. As the time between pulses increases the current charging the loop filter increases, and as the time between pulses decreases the current charging the loop filter decreases thereby maintaining a constant loop gain independent of the data pattern.

In a preferred embodiment, a voltage controlled oscillator is provided for generating a clock having a frequency equal to the data rate and which is proportional to an applied voltage. A phase comparator receives and compares phases of data pulses and the clock, and the phase comparator generates a phase comparison signal indicative of the clock leading or lagging the data pulses in phase. Counter means is provided for receiving the clock and the data pulses and generating a count of clock cycles between data pulses. A variable current source provides a current the magnitude of which is proportional to the count, the current being positive when the clock is lagging the data pulses in phase and being negative when the clock is leading pulses in phase. The variable current is applied to a current to voltage converter for converting the current to voltage for controlling the voltage controlled oscillator.

The invention and objects and features thereof will be more readily apparent from the following detailed description and appended claims when taken with the drawing.

DETAILED DESCRIPTION OF ILLUSTRATIVE EMBODIMENTS

Figure 1A:
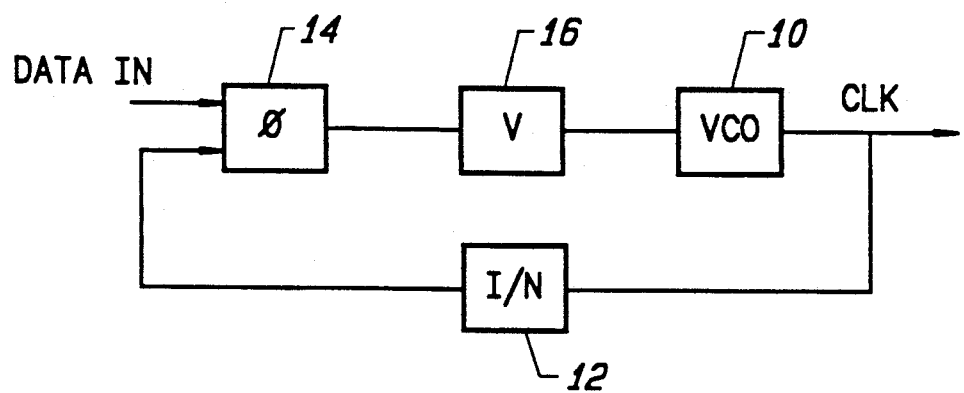
FIG. 1A and FIG. 1B are functional block diagrams illustrating the structure and operation of a phase lock loop.

Referring now to the drawing, FIG. 1A is a function diagram of a conventional phase lock loop. A voltage controlled oscillator 10 generates an output clock, CLK, which is fed back through a 1/N divider 12, as one input to a phase comparator 14. Another input of the phase comparator 14 receives data and generates a pulse representing the phase difference between the data and the divided clock signal. The pulse from the phase comparator 14 is then applied to a charge pump 16 which generates a voltage in proportion to the duration of the applied pulse. If the divided clock signal is lagging the data in, a positive pulse is applied to the charge pump 16, and if the divided clock is leading the data in, a negative pulse will be applied to the charge pump 16. The voltage developed by the charge pump 16 is then applied to control the phase and frequency of the voltage controlled oscillator 10.

Figure 1B:
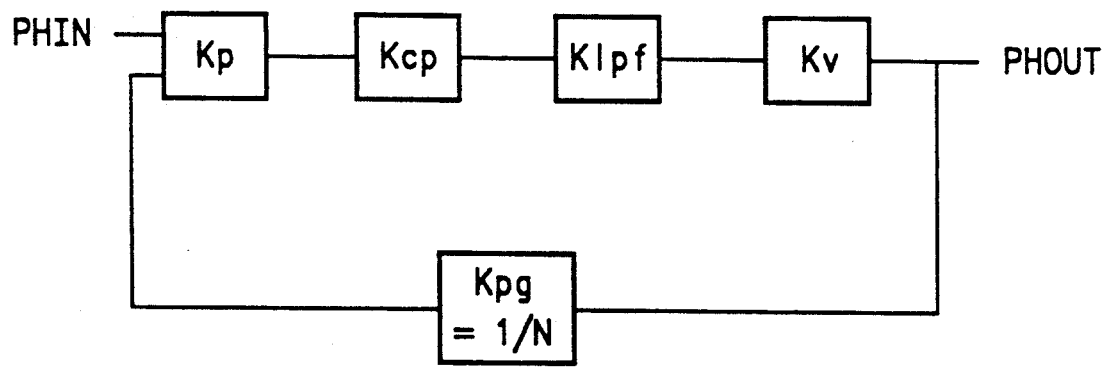

FIG. 1B is a functional diagram illustrating the open loop gain of the circuit of FIG. 1A which is given as follows:

$$\text{open loop gain } G = Kp.Kcp.Klpf.Kv.Kpg.1/N$$

where
- $Kp$ = phase comparator gain
- $Kcp$ = charge pump gain
- $Klpf$ = loop filter
- $Kv$ = VCO gain
- $Kpg$ = pulse gate gain
- $N$ = # of VCO cycles per data pulse.

When the data pattern is uniform, the loop gain is constant. However, when the data pattern is not uniform the loop gain varies thereby causing erratic operation of the voltage controlled oscillator.

As noted above, U.S. Pat. No. 4,644,420 discloses a phase locked loop having a sample and hold phase comparator to achieve a constant loop gain in the presence of a non-uniform data pattern. However, the voltage controlled oscillator must run at a frequency 32 times higher than the data rate. Such an oscillator is beyond practical limits of existing integrated technologies when used with conventional data rates for magnetically encoded data in tape and disk.

In accordance with the present invention, a constant loop gain is maintained independent of the data pattern by providing a programmable current source to make the current proportional to the number of VCO clock periods between data pulses. As the time between pulses increases the current charging the loop filter increases and as the time between pulses decreases the current charging the loop filter decreases to maintain a constant loop gain.

Figure 2:
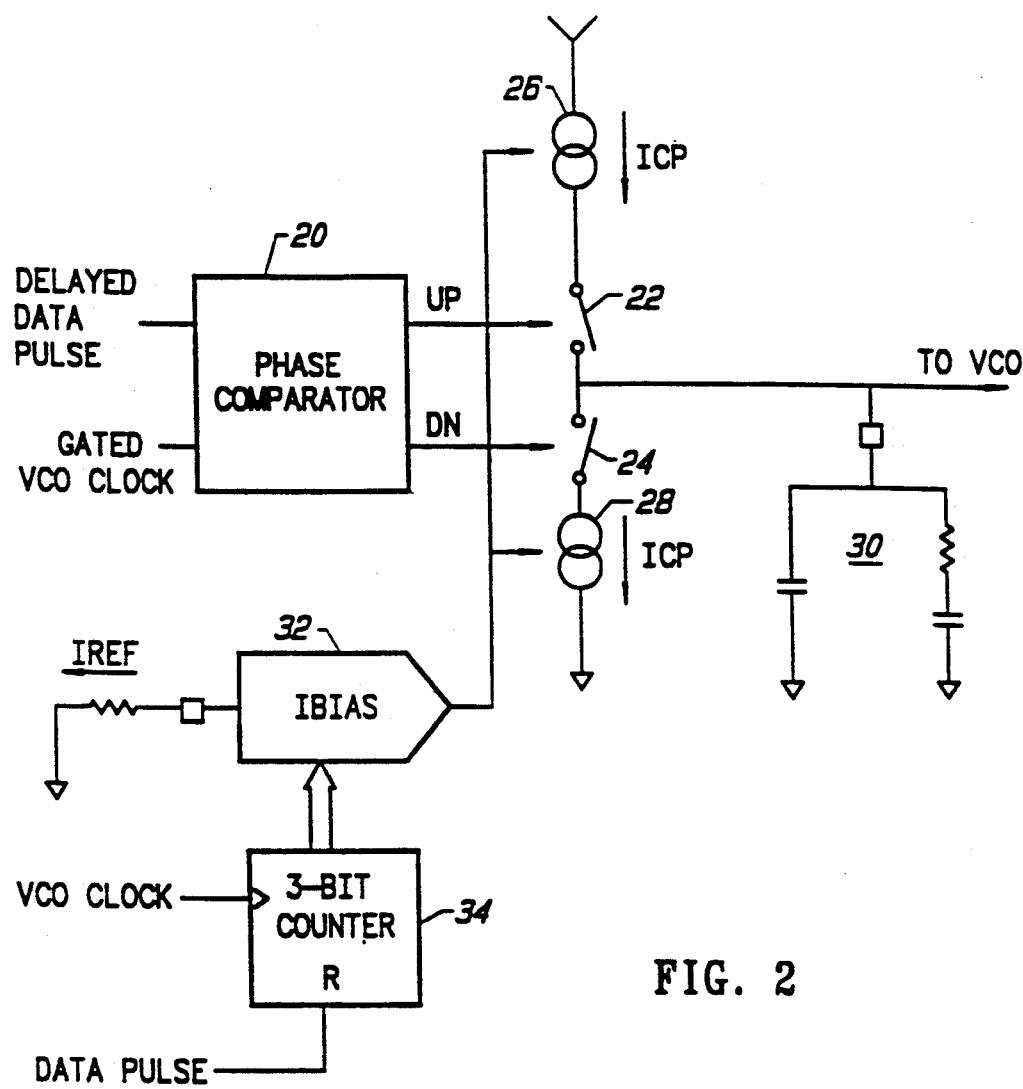
FIG. 2 is a schematic of a constant gain charge pump in accordance with the present invention.

FIG. 2 is a schematic of one embodiment of a constant gain charge pump in accordance with the invention. A delayed data pulse and the gated VCO clock are applied as inputs to a phase comparator 20, and an up output is generated when the gate VCO clock lags the data pulse, and a down output is generated when the VCO clock is leading the data pulse. The up and down outputs control switches 22, 24, which control the connection of $I_{cp}$ current sources 26, 28 to a loop filter circuit shown generally at 30. When switch 22 is closed, current source 26 supplies current to the loop filter 30 thereby increasing the voltage which is applied to the VCO. Conversely, when switch 24 is closed, current source 28 withdraws current from the loop filter 30 thereby reducing the voltage to the VCO. The data pulse input to the phase comparator 20 is delayed so that the counter 34 is reset after the phase comparator provides an update.

The magnitude of the current, $I_{cp}$, is controlled by a bias current, $I_{bias}$, which is applied to the current sources 26, 28 from a programmable current source 32. The current source 32 has a plurality of switches or FETs in parallel which can be selectively closed to vary the magnitude of the reference $I_{ref}$ which is applied to the current sources 26, 28. The closing of the current switches is controlled by a three bit counter 34 which receives the VCO clock and the stream of data pulses and counts the number of clock periods between data pulses. The counter is reset when each data pulse occurs and the cycle starts over. The counter addresses the programmable current reference, and the current source then is used as a reference for the current sources driving the loop filter 30.

Figure 3:
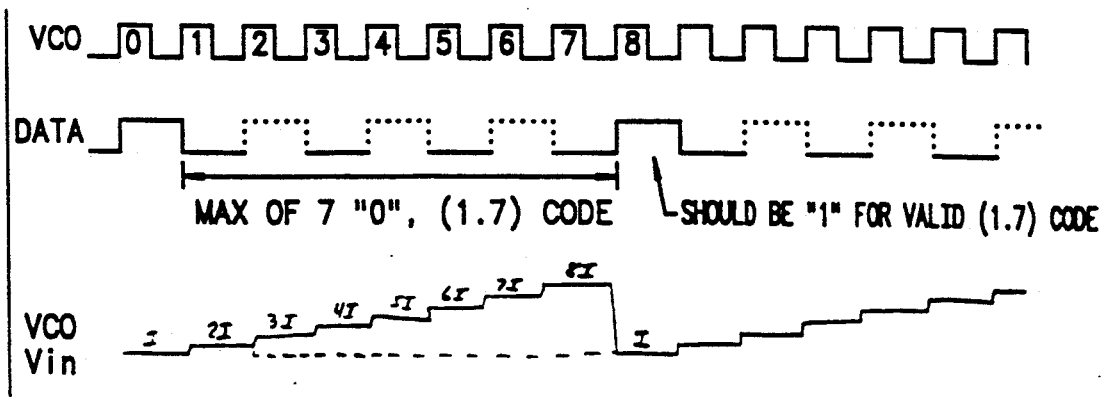
FIG. 3 is an illustration of clock signals, data pulses, and a variable current as used in the constant gain charge pump of FIG. 2.

FIG. 3 is an illustration of clock signals, data pulses, and a variable current as used in the constant gain charge pump of FIG. 2. In a (1, 7) code a "1" is indicated by the presence of a pulse and a "0" is indicated by the lack of a pulse. For a valid data pattern the counter will reset after seven zeros. Thus, the data stream can have a maximum of seven zeros between data pulses or fewer zeros depending on the presence of encoded "1"s. Referring to FIG. 3, the VCO clock and a (1, 7) coded data stream are illustrated with the data stream having the maximum of seven "0" between pulses. In this case, the current for charging the charge pump is stepped from a value of I to a value of 8I before being reset to the value I. That is, the charge pump current is stepped so that the net result is the same as if it is updated at every valid clock cycle. Since the current source is reset on each positive data pulse, the presence of one or more "1"s following a reset pulse will limit the current magnitude into or out of the charge pump.

Note above that the data pulse input to the phase comparator is delayed so that the counter is reset after the phase comparator provides an update.

Accordingly, by making the current proportional to the number of VCO clock periods between data pulses a constant loop gain is maintained which is independent of data pattern.

Figure 4:
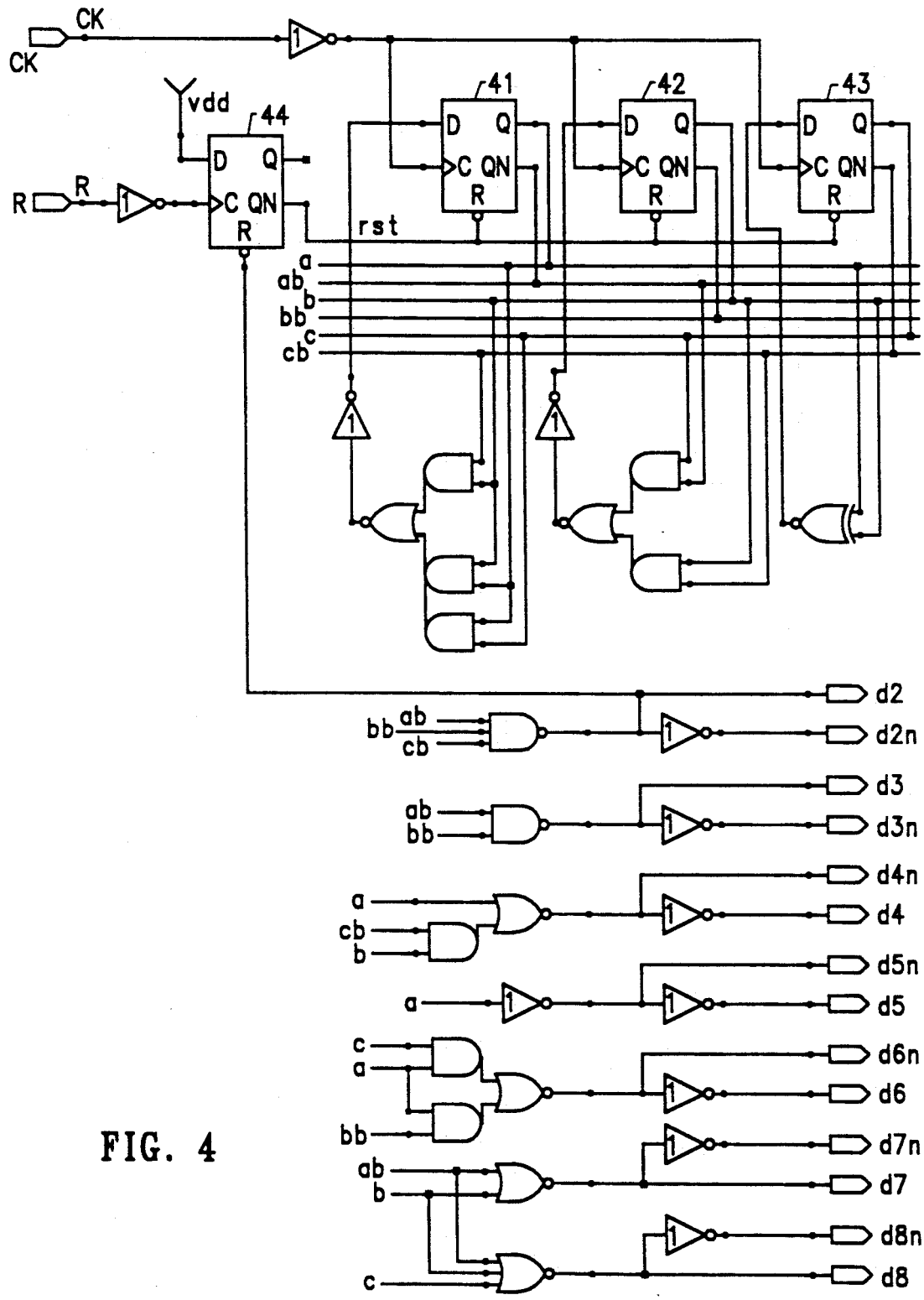
FIG. 4 is a schematic of a three bit counter as employed in one embodiment of the invention.

FIG. 4 is a schematic of one three bit counter which has been employed with a (1, 7) code. The clock is inverted and applied to the clock input of three D flip flops 41, 42, 43. A reset pulse (data pulse) is inverted and applied through D flip flop 44 to the resets of flip flops 41, 42, 43. The Q and $\overline{Q}$ outputs of the flip flops 41, 42, 43 are then combined logically to provide seven sets of control signals (D2, $\overline{D2}$-D8, $\overline{D8}$) which sequentially control the seven current switches in the $I_{bias}$ circuit 32 of FIG. 2. Accordingly, a maximum of seven current steps can be applied as a bias current in controlling the current sources 26, 28 as required in a (1, 7) code, as set forth in the following table:

| CHARGE PUMP OPERATION | | |
|---|---|---|
| DATA PATTERNS | N | Icp |
| 101 | 2 | 2/8 Iref |
| 1001 | 3 | 3/8 Iref |
| 10001 | 4 | 4/8 Iref |
| 100001 | 5 | 5/8 Iref |
| 1000001 | 6 | 6/8 Iref |
| 10000001 | 7 | 7/8 Iref |
| 100000001 | 8 | 8/8 Iref |

Kcp α Icp α N

There has been described an improved phase lock loop oscillator using a programmable current source and charge pump whereby the current charging the loop filter varies proportionally to the number of VCO clock periods between data pulses, thereby maintaining a constant loop gain independent of the data pattern. The counter pattern is readily programmable to adapt to different coding formats, and the charge pump circuitry is readily employed with conventional phase lock loop circuitry. While the invention has been described with reference to a specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A phase locked loop oscillator comprising
a voltage controlled oscillator for generating a clock having a frequency which is proportional to an applied voltage,
a phase comparator for receiving and comparing phases of data pulses and said clock and generating a phase comparison signal indicative of said clock leading or lagging said data pulses in phase,
counter means for receiving said clock and said data pulses and generating a count of clock cycles between data pulses,
a current to voltage convertor for converting a current to a voltage for controlling said voltage controlled oscillator,
a variable current source for applying a current to said current to voltage convertor, the magnitude of said current being proportional to said count, said current being positive into said convertor when said clock is lagging said data pulses in phase and being negative when said clock is leading said data pulses in phase, and
means for applying said voltage from said current to voltage convertor to said voltage controlled oscillator as a control voltage.

2. A phase locked loop oscillator comprising
a voltage controlled oscillator for generating a clock having a frequency which is proportional to an applied voltage,
a phase comparator having two inputs for receiving data pulses and said clock from said voltage controlled oscillator and having a first output when said clock is lagging said data pulses and a second output when said clock is leading said data pulses, a variable current source for generating a control current, counter means for receiving said clock and said data pulses and generating a count of clock cycles between data pulses, means for applying said count to said variable current source whereby said control current is proportional to said count, a current to voltage convertor for converting a current to a voltage, means for applying a charging current to said current to voltage convertor, the magnitude of said charging current being proportional to the magnitude of said control current, said charging current being positive when said clock is lagging said data pulses, and said charging current being negative when said clock is leading said data pulses, and means for applying the voltage from said current to voltage convertor to said voltage controlled oscillator as a controlled voltage.

3. In a phase locked loop circuit, a charge pump for use in obtaining a control voltage for a voltage controlled oscillator which generates a clock in response to data pulses comprising a current to voltage convertor, counter means for receiving said clock and said data pulses and generating a count of clock cycles between data pulses, and a variable current source for applying a current to said current to voltage convertor, the magnitude of said current being proportional to said count, said current being positive into said convertor when said clock is lagging said data pulses in phase and being negative away from said convertor when said clock is leading said data pulses in phase.

* * * * *